United States Patent [19]

Yamaguchi et al.

[11] Patent Number: 5,068,700
[45] Date of Patent: Nov. 26, 1991

[54] LATERAL CONDUCTIVITY MODULATED MOSFET

[75] Inventors: Yoshihiro Yamaguchi, Urawa; Kiminori Watanabe, Kawasaki; Akio Nakagawa, Hiratsuka, all of Japan

[73] Assignee: Kabushiki Kaisha Toshiba, Kawasaki, Japan

[21] Appl. No.: 622,351

[22] Filed: Nov. 29, 1990

Related U.S. Application Data

[63] Continuation of Ser. No. 440,191, Nov. 22, 1989, abandoned.

[30] Foreign Application Priority Data

Nov. 29, 1988 [JP] Japan ............................ 63-301718
May 17, 1989 [JP] Japan ............................ 1-123601

[51] Int. Cl.$^5$ ................. H01L 29/68; H01L 29/78; H01L 29/10; H01L 29/74
[52] U.S. Cl. ........................... 357/23.8; 357/23.1; 357/23.4; 357/38
[58] Field of Search .................. 357/23.4, 23.1, 23.8, 357/23.14, 38

[56] References Cited

U.S. PATENT DOCUMENTS

| | | | |
|---|---|---|---|
| 4,300,150 | 11/1981 | Colak | 357/23.4 |
| 4,593,458 | 6/1986 | Adler | 357/23.8 |
| 4,672,407 | 6/1987 | Nakagawa et al. | 357/23.8 |
| 4,680,604 | 6/1987 | Nakagawa et al. | 357/23.4 |
| 4,742,380 | 5/1988 | Chang et al. | 357/23.4 |
| 4,779,123 | 10/1988 | Bencuya et al. | 357/23.4 |
| 4,782,372 | 11/1988 | Nakagawa et al. | 357/23.8 |
| 4,782,379 | 11/1988 | Baliga | 357/23.4 |
| 4,811,065 | 3/1989 | Cogan | 357/23.4 |
| 4,819,045 | 4/1989 | Murakami | 357/23.4 |
| 4,841,345 | 6/1989 | Majumdar | 357/23.1 |
| 4,857,983 | 8/1989 | Baliga et al. | 357/23.4 |
| 4,861,731 | 8/1989 | Bhagat | 357/38 |
| 4,873,563 | 10/1989 | Dalco et al. | 357/23.4 |
| 4,939,566 | 7/1990 | Singer et al. | 357/23.8 |

FOREIGN PATENT DOCUMENTS

| | | | |
|---|---|---|---|
| 133642A | 3/1985 | European Pat. Off. | 357/23.4 |
| 0228107 | 11/1986 | European Pat. Off. | 357/238 |
| 57-206073 | 12/1982 | Japan | 357/23.4 |
| 62-039069 | 2/1987 | Japan | 357/23.4 |
| 62-058683 | 3/1987 | Japan | 357/23.8 |
| 2197987 | 11/1987 | United Kingdom | 357/23.8 |

OTHER PUBLICATIONS

MuKherjee et al., "LDMOS and LIGT's in CMOS Technology for Power Integrated Circuits", IEDM, Dec. 1987, pp. 778-781.

Robinson et al., "Lateral Insulated Gate Transistors with Improved Latching Characteristics," IEDM, Dec. 1985, pp. 744-747.

(List continued on next page.)

Primary Examiner—Andrew J. James
Assistant Examiner—Daniel Kim
Attorney, Agent, or Firm—Oblon, Spivak, McClelland, Maier & Neustadt

[57] ABSTRACT

A lateral conductivity modulated MOSFET comprises a semiconductor wafer, a first-conductivity type base layer selectively formed in a surface region of the semiconductor wafer, a second-conductivity type source layer selectively formed in a surface region of the first-conductivity type base layer, a second-conductivity type base layer selectively formed in the semiconductor wafer, a first-conductivity type drain layer formed in a surface region of the second-conductivity type base layer, a gate insulation film formed on that surface portion of the first-conductivity type base layer which is sandwiched between the source layer and the second-conductivity type base layer, a gate electrode formed on the gate insulation film, a source electrode in contact with both the source layer and the first-conductivity type base layer, and a drain electrode in contact with the drain layer. A second-conductivity type cathode layer is formed in a surface region of the semiconductor wafer in such a manner that it is located adjacent to the second-conductivity type base layer. A cathode electrode is in contact with the cathode layer and is kept at the same potential level as that of the drain electrode.

21 Claims, 13 Drawing Sheets

OTHER PUBLICATIONS

Gough et al., "Fast Switching Lateral Insulated Gate Transistor," IEDM, Dec. 1986, pp. 218–221.
Extended Abstracts of the 20th International Conference on Solid State Devices and Materials, Tokyo, 24th–26th Aug. 1988, pp. 33–36, Tokyo, JP; A. Nakagawa et al.: "500V Lateral Double Gate Bipolar-Mode MOSFET (DGIGBT) Dielectrically Isolated by Silicon Wafer Direct-Bonding (DISDB)".
Electronics Letters, 7th Jun. 1984, vol. 20, No. 12, p. 519, Lateral Resurfed COMFET: M. Parwich et al.
IEDM 85, p. 740, Analysis of the Lateral Insulated Gate Transistor; M. R. Simpson et al.

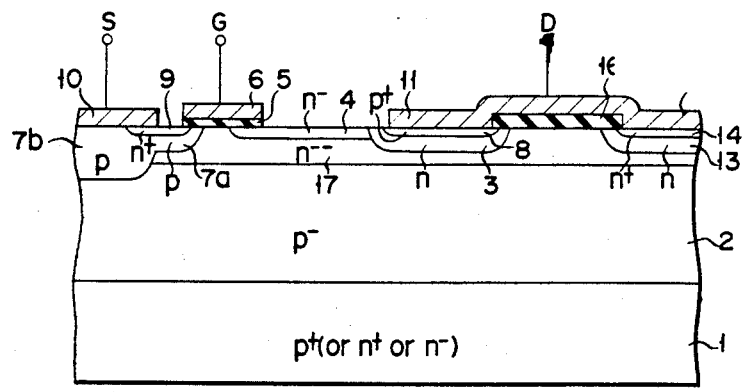
F I G. 5
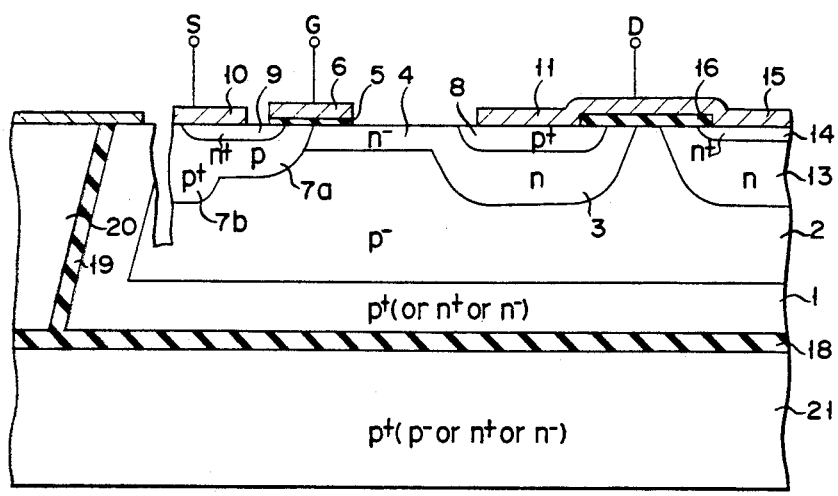
F I G. 6

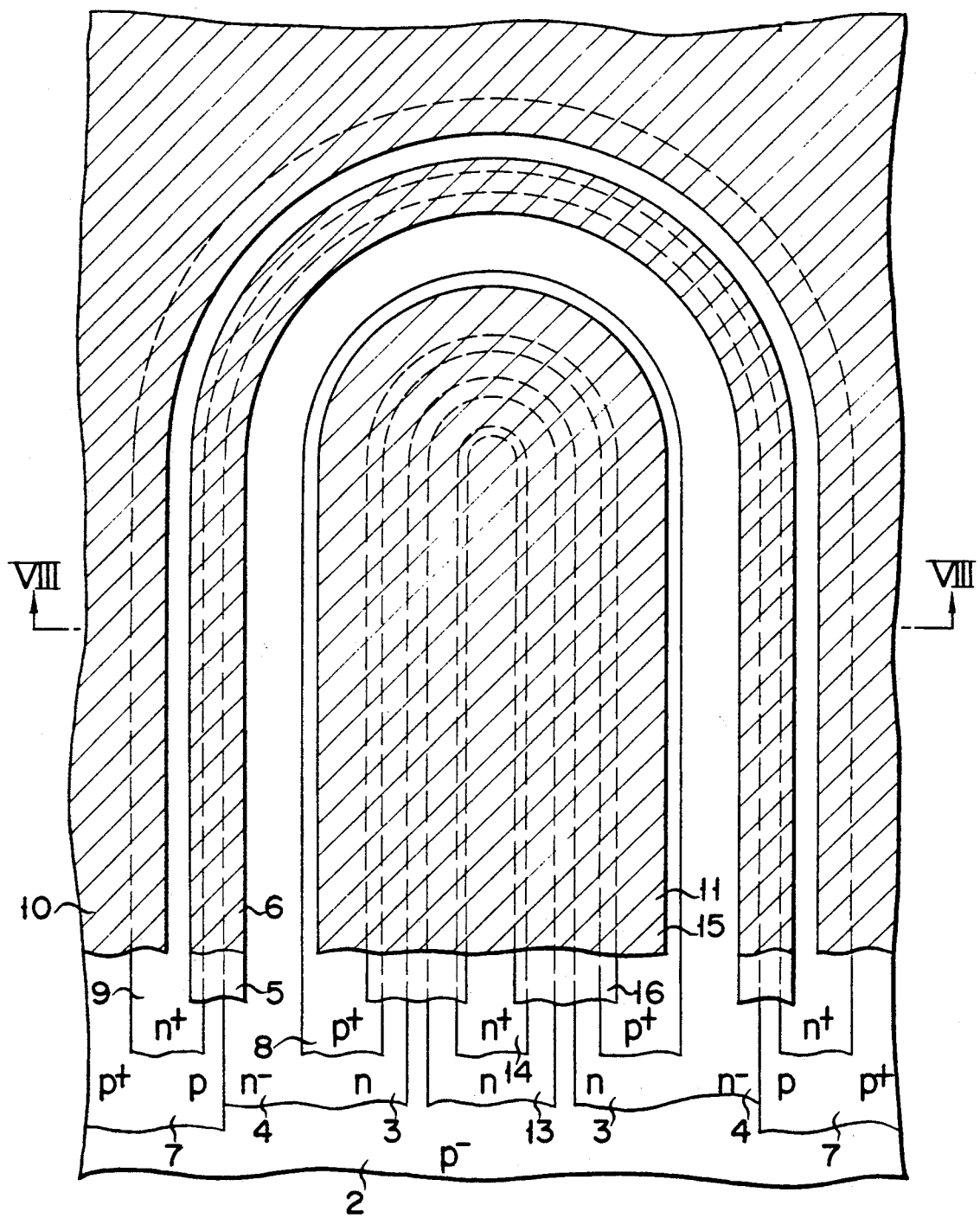
F I G. 7

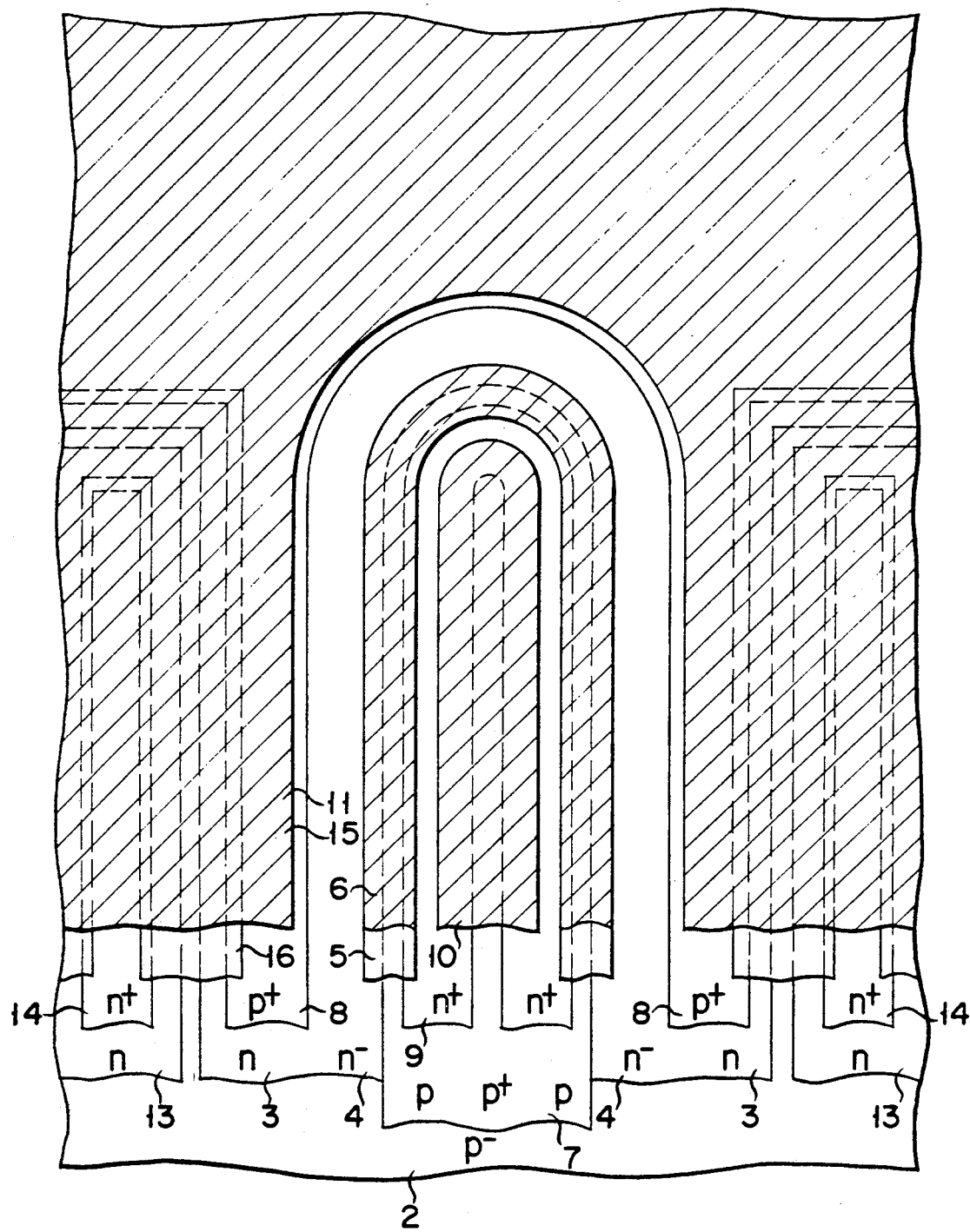
F I G. 12

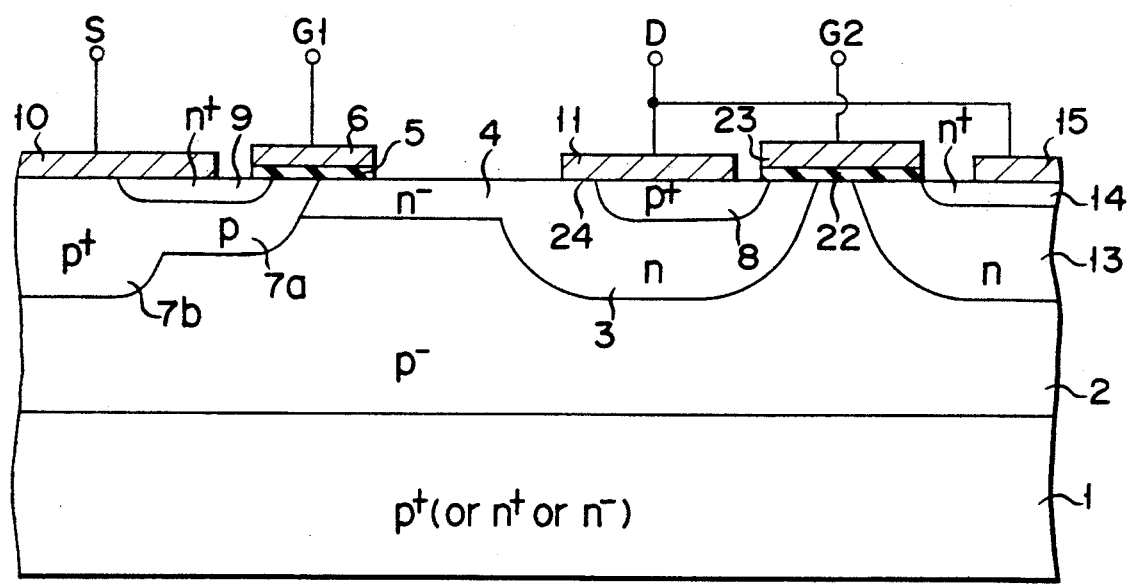
F I G. 17

LATERAL CONDUCTIVITY MODULATED MOSFET

This application is a continuation of application Ser. No. 07/440,191, filed on Nov. 22, 1989, now abandoned.

BACKGROUND OF THE INVENTION

1. Field of the Invention

The present invention relates to a lateral conductivity modulated MOSFET wherein a drain, a source, and a gate are formed on one surface of a semiconductor wafer.

2. Description of the Related Art

A lateral conductivity modulated MOSFET which utilizes conductivity modulation caused by electrons and holes accumulated in a drift layer is disclosed in M. Darwish et al. "Lateral Resurfed COMFET." *Electronics Letters.* 7th June 1984, Vol. 20 No. 12, pp. 519–520. In this type of lateral conductivity modulated MOSFET, carriers accumulated in an n-type base layer must be swiftly eliminated, so as to increase the switching speed at the time of turn-off operation. If the electrons do not swiftly move from the n-type base layer to the drain layer, a pnp transistor constituted by a p-type drain layer, an n-type base layer and p-type base layer operates. As a result, a large amount of tail current flows through the conductivity modulated MOSFET, thus lengthening the turn-off interval. One of the methods of achieving a speedy turn-off operation is to shorten the life of the carriers in the n-type base layer. Although this method improves the turn-off characteristic, it undesirably raises the ON-state voltage of the element.

In the case where a conductivity modulated MOSFET is employed in an inverter circuit of a motor driving circuit, a diode is connected to the MOSFET in the backward direction and in parallel thereto, as is shown in FIG. 1. The reason for connecting the diode in this fashion is to regenerate the energy stored in the inductance component of the motor. However, such connection of the diode results in an increase in the size of the device and an increase in the manufacturing cost of the device.

To solve these problems, an anode-short structure is proposed. This structure is disclosed in, e.g., M. R. Simpson et al. "Analysis of the Lateral Insulated Gate Transistor." *IEDM* 85. pp 740–743. If the anode-short structure is employed, carriers accumulated in the n-type base layer are efficiently expelled through the anode-short portion during turn-off operation, so that a high-speed switching operation can be obtained. Moreover, a device employing the anode-short structure naturally incorporates a circuit equivalent to the diode shown in FIG. 1. Therefore, it is not necessary to externally connect a diode to the conductivity modulated MOSFET.

However, if the anode-short structure is employed, holes cannot be efficiently injected from the p-type drain layer into the n-type base layer. Since, therefore, the advantageous effects of conductivity modulation cannot be sufficiently obtained, the ON-state voltage of the MOSFET is undesirably raised. For satisfactory conductivity modulation, the lateral resistance of the n-type base layer located below the drain layer should be increased. To be more specific, the following measures should be taken:

(1) To widen the $p^+$-type drain layer extending to the anode-short portion;

(2) To reduce the impurity concentration in the n-type base layer; and (3) To thin the n-type base layer located below the $p^+$-type drain layer.

However, if measure (1) is taken, the element area of the conductivity modulated MOSFET will be increased. Likewise, if measure (2) or (3) is taken, the breakdown voltage of the conductivity modulated MOSFET will be lowered.

As may be understood from the above, if a conventional conductivity modulated MOSFET employs an anode-short structure, the switching characteristic at the time of turn-off operation can be improved, but the ON-state voltage is inevitably raised. In order to employ the anode-short structure without raising the ON-state voltage, either an increase in the element area or a decrease in the breakdown voltage of the device is inevitable.

SUMMARY OF THE INVENTION

Accordingly, the first object of the present invention is to provide a lateral conductivity modulated MOSFET which is free of the problems arising from the incorporation of an anode-short structure.

The second object of the present invention is to provide a lateral conductivity modulated MOSFET which has a low ON-state voltage and exhibits a high-speed turn-off characteristic.

To attain these objects, the present invention provides a first type lateral conductivity modulated MOSFET wherein a first conductivity type drain layer is formed in a second conductivity type base layer, and second-conductivity type cathode layer is formed adjacent to the second-conductivity type base layer. The cathode layer is isolated from the second-conductivity type base layer by a pn junction, and is in contact with a cathode electrode whose potential is the same as that of a drain electrode.

The present invention also provides a second type lateral conductivity modulated MOSFET wherein a second gate electrode is formed, with a gate insulation film interposed, on that surface portion of the second-conductivity type base layer which is sandwiched between the drain layer and the wafer region.

In the first type MOSFET, a substantial anode-short structure is not formed until a large amount of current flows through the MOSFET. Let it be assumed that the first and second-conductivity types are p-type and n-type respectively, and that the n-type cathode layer is located adjacent to the n-type base layer. When, in this case, the element is turned on, the electrons injected from the n-type source layer into the n-type base layer are absorbed in the p-type drain layer as long as the electrons are not injected in large qualities. At this time, holes are injected from the drain layer into the n-type base layer, so that conductivity modulation occurs. When the current increases and the electrons are injected in large quantities, the holes injected from the p-type drain layer to the n-type base layer are crowded out of the n-type base layer and are stored in the wafer. When a great deal of holes are stored in the wafer, electrons are injected from the n-type base layer into the wafer. At the time of turn-off operation, these electrons are easily expelled from the wafer into the cathode layer, which is at the same potential level as that of the drain layer. In the first type MOSFET, therefore, a substantial anode-short structure is formed when a large amount of electrons are injected. In addition, the ON-state voltage is low, and the turn-off characteristic is satisfactory.

In connection with the first type MOSFET, it should be noted that the n-type base layer and the n-type cathode layer are isolated from each other by a pn junction. Therefore, unlike the case of a conventional conductivity modulated MOSFET incorporating an anode-short structure, the size of the element need not be increased, and the breakdown voltage does not lower. Moreover, a pn junction diode is equivalently formed between the n-type cathode layer and the p-type base layer in such a manner that it is connected to the conductivity modulated MOSFET in the backward direction and in parallel thereto. Therefore, the first type conductivity modulated MOSFET of the present invention has a reverse conduction function as well.

In the second type MOSFET, a channel is formed in the surface region of the second base layer by applying bias to the second gate electrode at the time of turn-on operation. As a result of the formation of the channel, a sufficient amount of carriers can be injected from the drain layer to the wafer region. In spite of the anode-short structure, therefore, the carrier injection efficiency does not lower at the time of turn-on operation, and thus the ON-state voltage is not raised. Therefore, the second type MOSFET of the present invention achieves both a low ON-state voltage and a satisfactory turn-off characteristic.

BRIEF DESCRIPTION OF THE DRAWINGS

Other objects and advantages will be apparent from the following description taken in conjunction with the accompanying drawings in which:

FIG. 5 is a sectional view of a lateral conductivity modulated MOSFET according to the fourth embodiment of the present invention;

FIG. 6 is a sectional view of a lateral conductivity modulated MOSFET according to the fifth embodiment of the present invention;

FIG. 7 is a plan view of a lateral conductivity modulated MOSFET according to the sixth embodiment of the present invention;

FIG. 12 is a plan view of a lateral conductivity modulated MOSFET according to the ninth embodiment of the present invention;

FIG. 17 is a sectional view of a lateral conductivity modulated MOSFET according to the thirteenth embodiment of the present invention;

FIG. 18 is a sectional view of a lateral conductivity modulated MOSFET according to an eleventh embodiment of the present invention.

DETAILED DESCRIPTION OF THE PREFERRED EMBODIMENTS

Figure 1:
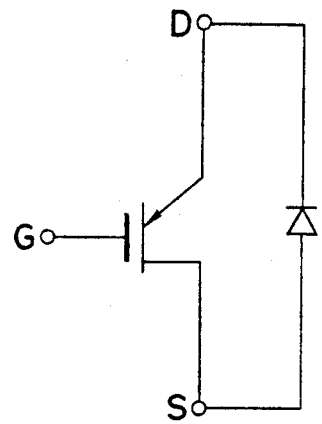
FIG. 1 is an equivalent circuit diagram regarding a diode which is connected to a conventional conductivity modulated MOSFET in the backward direction and in parallel thereto.
Figure 2:
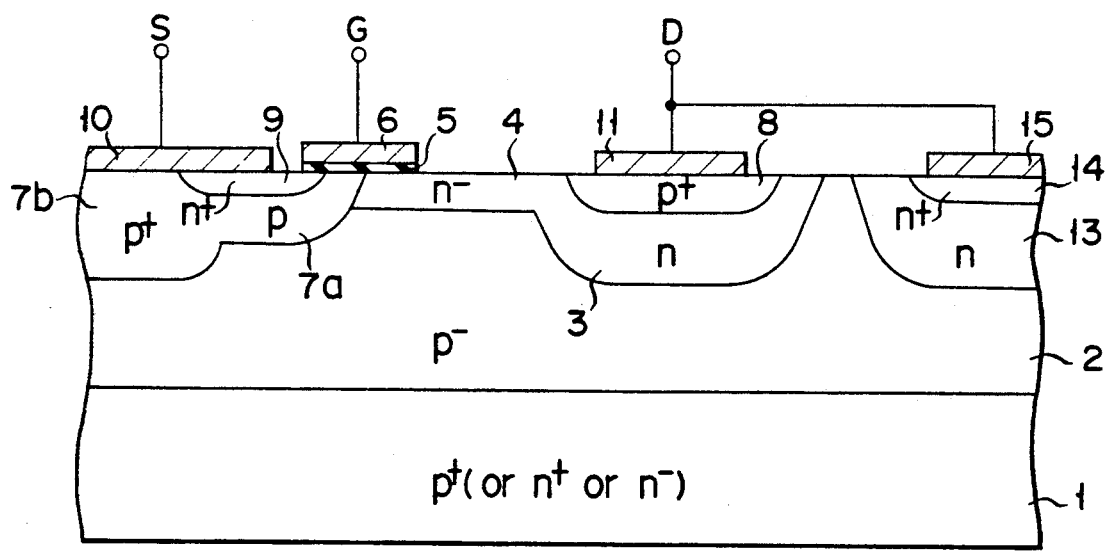
FIG. 2 is a sectional view of a lateral conductivity modulated MOSFET according to the first embodiment of the present invention.

A conductivity modulated MOSFET according to the first embodiment of the present invention may now be described, with reference to FIG. 2. First of all, a wafer made up of silicon substrate 1 and $p^-$-type layer 2 epitaxially grown on silicon substrate 1 is prepared. Silicon substrate 1 may be a $p^+$-type, an $n^+$-type, or an $n^-$-type. P-type base layer 7 is selectively formed in a surface region of $p^-$-type layer 2. $N^+$-type source layer 9 is selectively formed in a surface region of p-type base layer 7. $N^-$-type high-resistance base layer 4 (i.e., a drift layer) and n-type low-resistance base layer 3 (i.e., a buffer layer) are formed in a surface region of $p^-$-type layer 2 such that they are located adjacent to p-type base layer 7. $N^-$-type drift layer 4 is connected to both p-type base layer 7 and n-type buffer layer 3. $P^+$-type drain layer 8 is formed in a surface region of n-type buffer layer 3. That portion of p-type base layer 7 which is sandwiched between $n^+$-type source layer 9 and $n^-$-type drift layer 4 functions as a channel region. On this channel region, gate insulation film 5 is formed, and gate electrode 6 is formed on gate insulation film 5. Source electrode 10 is in contact with both source layer 9 and base layer 7. Drain electrode 11 is in contact with $p^+$-type drain layer 8.

N-type cathode layer 13 is selectively formed in a surface region of $p^-$-type layer 2. N-type cathode layer 13 and p-type base layer 7 are formed in such a manner as to sandwich n-type buffer layer 3, but n-type cathode layer 13 is isolated from n-type buffer layer 3 by $p^-$-type layer 2. $N^+$-type layer 14 is formed in a surface region of n-type cathode layer 13, and cathode electrode 15 is in ohmic contact with $n^+$-type layer 14. Cathode electrode 15 and drain electrode 1 are connected to each other, so that they are at the same potential level.

The fundamental operation of the above conductivity modulated MOSFET will be described. To turn on the conductivity modulated MOSFET, a bias which is positive with reference to the potential of source electrode 10 is applied to gate electrode 6. As a result of the application of this bias, the channel region in the surface region of p-type base layer 7 is inverted in polarity, whereby electrons are injected from source layer 9 into $n^-$-type drift layer 4. When this electron current is injected via n-type buffer layer 3 into p-type drain layer 8, the pn junction formed by n-type buffer layer 3 and p-type drain layer 8 is biased in the forward direction. Therefore, holes are injected from p-type drain layer 8 into n⁻-type drift layer 4 through n-type buffer layer 3. As a result of this hole injection, conductivity modulation occurs in n⁻-type drift layer 4. Since the conductivity modulation substantially reduces the resistance of n⁻-type drift layer 4, a low ON-state voltage is obtained.

When a large amount of current flows through the MOSFET, the holes injected from p-type drain layer 8 are crowded out of both n-type buffer layer 3 and n⁻-type drift layer 4, and are therefore stored in p⁻-type layer 2. Since therefore, the electrons in n-type buffer layer 3 are also injected into p⁻-type layer 2, conductivity modulation occurs in p⁻-type layer 2 as well.

When gate electrode 6 is applied with a bias which is negative or zero with reference to the potential of source electrode 10, the channel inversion layer located below gate electrode 6 is lost. Therefore, the electron injection from source layer 9 is stopped. As a result, the conductivity modulated MOSFET is turned off. In the element of the first embodiment, n-type cathode layer 13 is located in the surface region of p⁻-type layer 2, the electrons accumulated in p⁻-type layer 2 are swiftly expelled from the MOSFET through n-type cathode layer 13 during turn-off operation. In other words, the element of the first embodiment operates as if it had an anode-short structure, and thus the switching speed at the turn-off operation is high. When the element of the first embodiment is turned on, it operates in a similar way to that of a conventional element. Since the element of the first embodiment does not incur an increase in the element area or a decrease in the breakdown voltage, which problems have hitherto arisen by the provision of an anode-short structure, it is possible to obtain a low ON-state voltage.

When the element of the present invention is turned off, n-type cathode layer 13 functions as a substantial anode-short structure. Therefore, a high-speed turn-off characteristic is obtained.

In the first embodiment, the diode constituted by p-type base layer 7, p⁻-type layer 2, and n-type cathode layer 13 is connected to the conductivity modulated MOSFET in the backward direction and in parallel thereto. Therefore, the MOSFET achieves a reverse conduction function, with no need to employ an external-connected diode.

Other embodiments of the invention may now be described. In the descriptions below, the portions corresponding to those of the first embodiment will be referred to by use of the same reference numerals, and a detailed explanation of them will be omitted.

Figure 3:
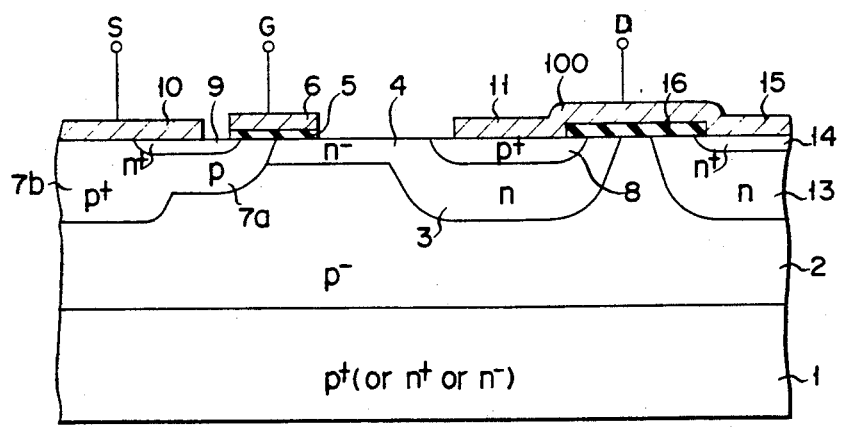
FIG. 3 is a sectional view of a lateral conductivity modulated MOSFET according to the second embodiment of the present invention.

First, the second embodiment of the present invention will be described, with reference to FIG. 3. In the second embodiment, insulation film 16 is formed between an edge of p⁺-type layer 8 and an edge of n⁺-type layer 14 in such a manner that n-type buffer layer 3, p⁻-type layer 2 and n-type cathode layer 13 are covered with insulation film 16. Conductor 100, serving as both drain electrode 11 and cathode electrode 15, is formed on insulation film 16.

Figure 4:
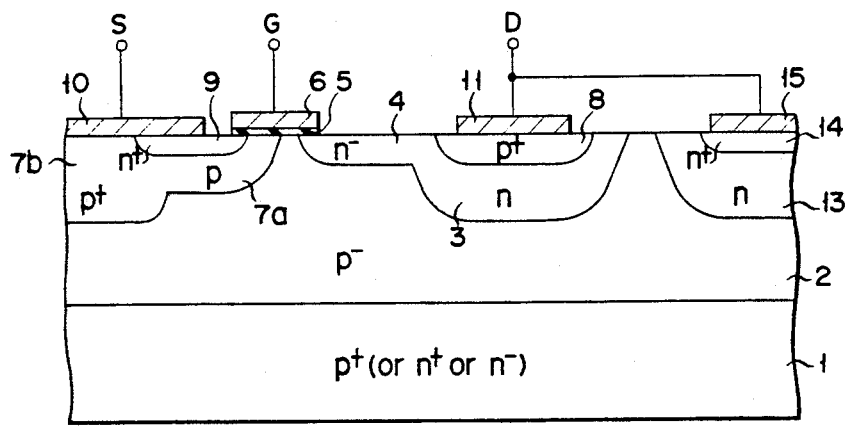
FIG. 4 is a sectional view of a lateral conductivity modulated MOSFET according to the third embodiment of the present invention.

FIG. 4 shows the third embodiment of the present invention In this embodiment, n⁻-type drift layer 4 is not in contact with p-type base layer 7; it is located slightly isolated from p-type base layer 7.

FIG. 5 shows the fourth embodiment of the present invention This embodiment employs a semiconductor wafer made up of: semiconductor substrate 1; p⁻-type layer 2 epitaxially grown on substrate 1; and high-resistance n⁻-type layer 17 epitaxially grown on p⁻-type layer 2. As long as n⁻-type layer 17 has sufficiently high resistance, n-type cathode layer 13 and n-type buffer layer 3 are substantially isolated from each other. Therefore, the fourth embodiment provides the advantages similar to those of the first embodiment. The n⁻-type layer 17 can be formed by impurity diffusion.

FIG. 6 shows the fifth embodiment of the present invention. This embodiment employs a wafer which is divided into two parts by a dielectric material. The part illustrated as being above oxide film 18 in FIG. 6 constitutes a first silicon substrate, while the part illustrated as being below oxide film 18 constitutes a second silicon substrate 21. The surfaces of the first and second silicon substrates are specularly polished. Oxide film 18, serving as an insulation film, is interposed between the specularly-polished surfaces of the first and second silicon substrates. With oxide film 18 interposed, the first and second silicon substrates are formed to be integral with each other by use of the direct bonding technique. The first silicon substrate has a groove used for forming an element separation region. Oxide film 19 is formed on the inner wall of the groove, and polycrystalline silicon film 20 is formed in the groove in such a manner as to fill the groove. This type of wafer, which has two parts isolated by a dielectric, may be also formed by burying single-crystal silicon into a polycrystalline silicon substrate.

With respect to the embodiments mentioned below, both the layout and sectional structure of the conductivity modulated MOSFETs of the present invention are illustrated in the accompanying drawings.

Figure 8:
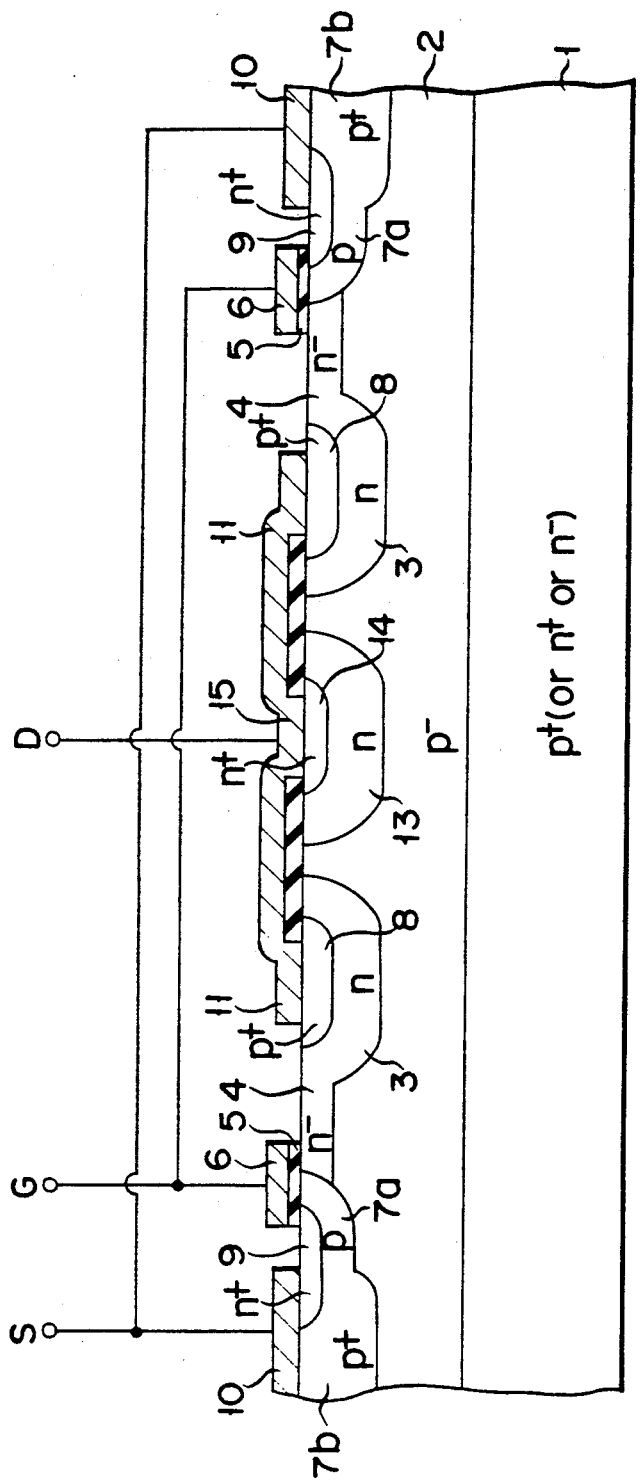
FIG. 8 is a sectional view taken along line VIII—VIII in FIG. 7.

FIGS. 7 and 8 show the sixth embodiment of the present invention. The conductivity modulated MOSFET of the sixth embodiment is obtained by modifying the second embodiment for practical use. In the sixth embodiment, gate electrode 6 is formed in the form of an elongated ring. On the inner side of gate electrode 6, p-type drain layer 8 is formed in the form of an elongated ring. On the outer side of gate electrode 6, n-type source layer 9 is formed in the form of an elongated ring. N-type cathode layer 13 is formed like an island and is surrounded by drain layer 8. It should be noted that the element shown in FIGS. 7 and 8 is one of the unit elements arranged in a stripe pattern. In other words, a plurality of unit elements, each having the structure shown in FIGS. 7 and 8, are arranged in a conductivty modulated MOSFET actually used.

Figure 9:
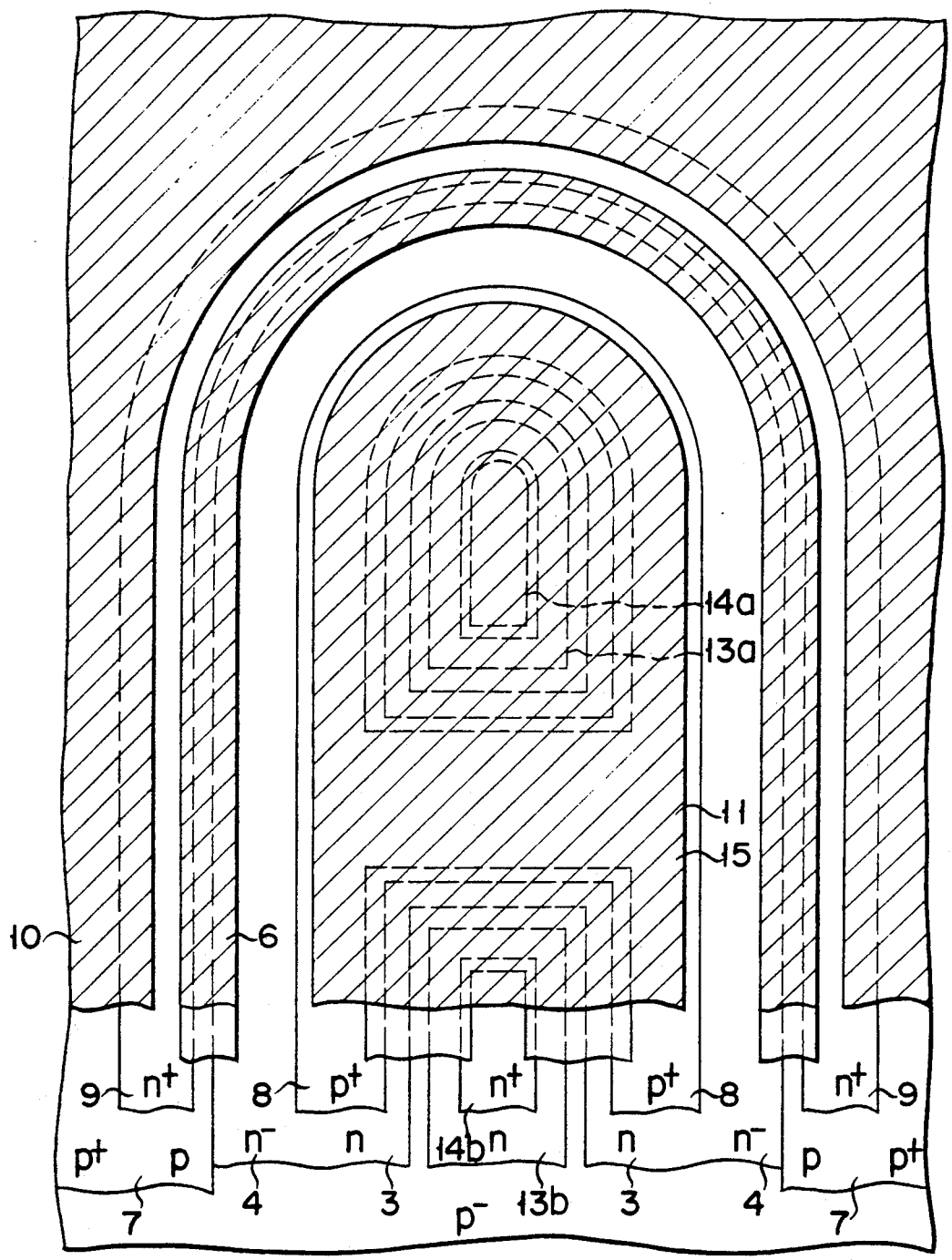
FIG. 9 is a plan view of a lateral conductivity modulated MOSFET according to the seventh embodiment of the present invention.

FIG. 9 shows the seventh embodiment of the present invention. This embodiment is obtained by modifying the sixth embodiment shown in FIGS. 7 and 8, and employs a plurality of cathode layers 13a, 13b . . . located in the region surrounded by drain layer 8.

Figure 10:
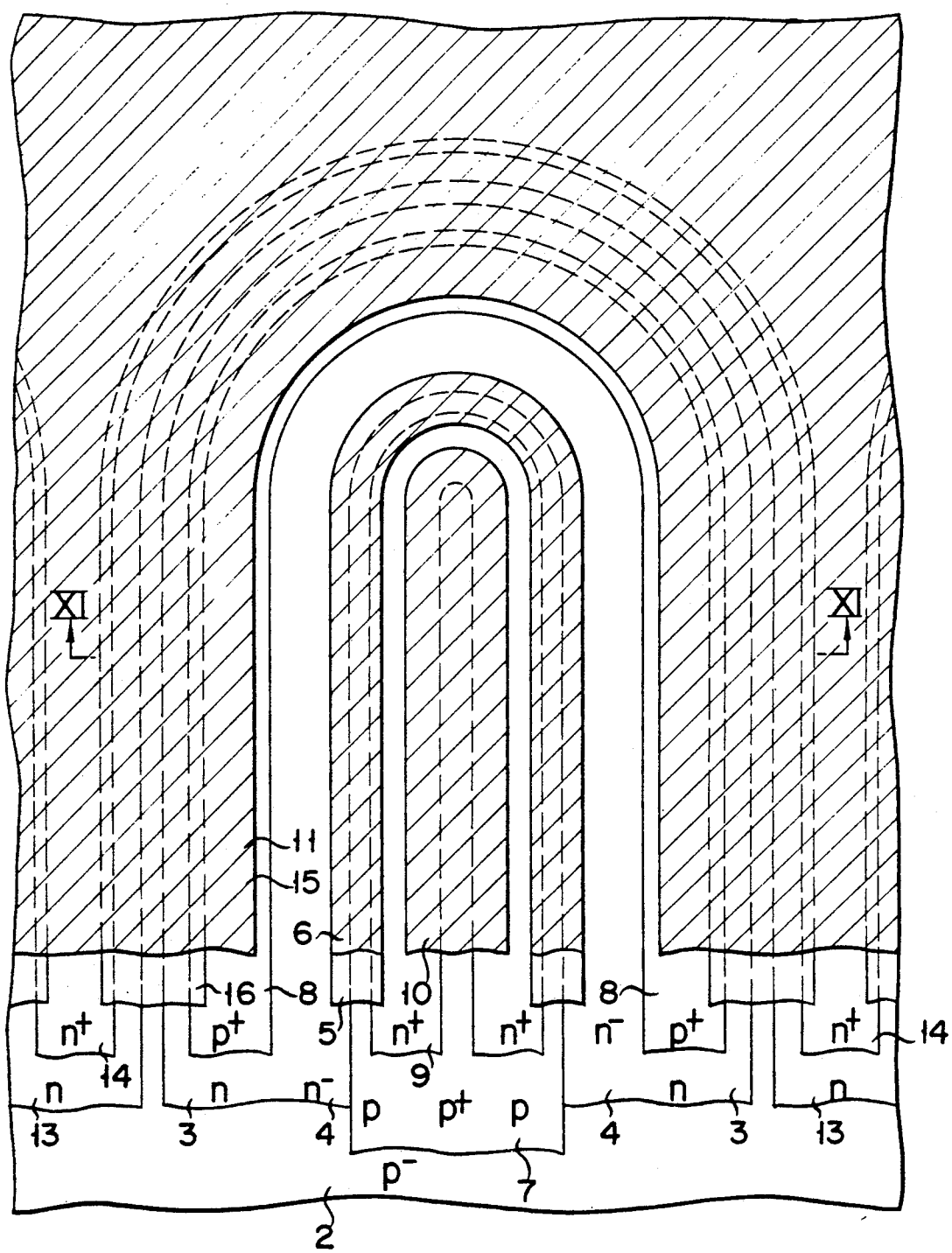
FIG. 10 is a plan view of a lateral conductivity modulated MOSFET according to the eighth embodiment of the present invention.
Figure 11:
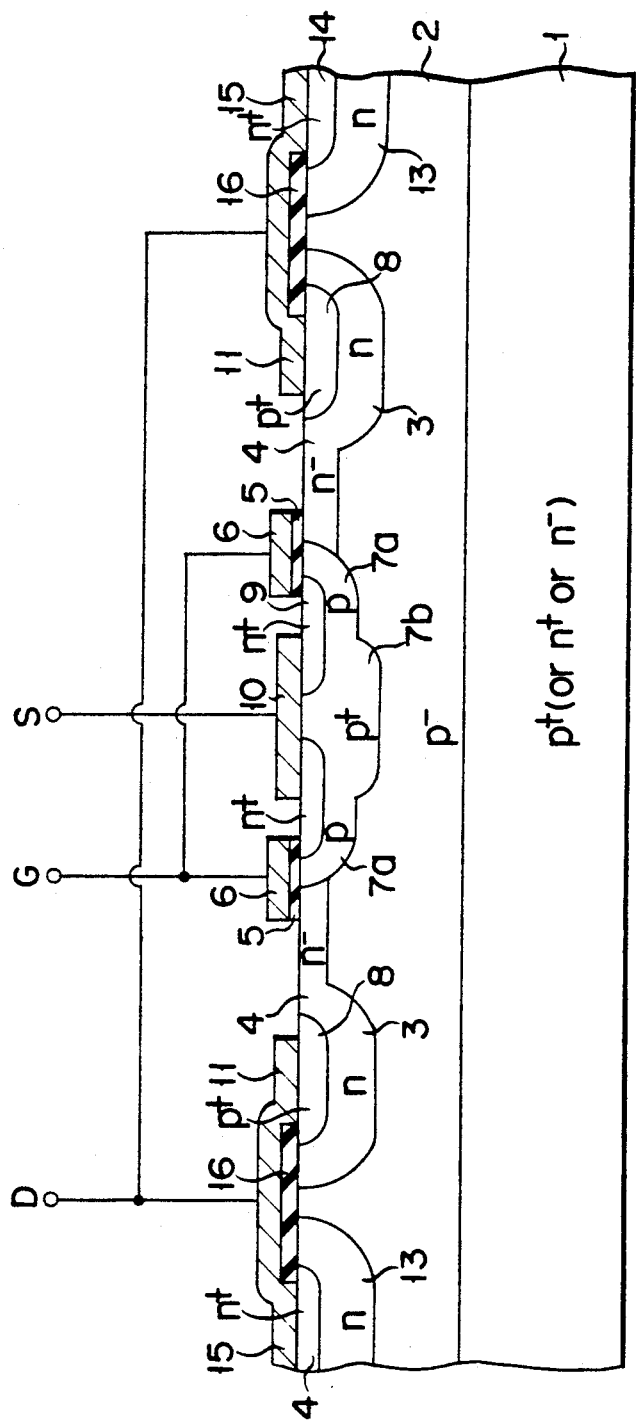
FIG. 11 is a sectional view taken along line XI—XI in FIG. 10.

FIGS. 10 and 11 show the eighth embodiment of the present invention. In this embodiment, the relationship between the drain and source is just the opposite to that of the sixth embodiment shown in FIGS. 7 and 8. Specifically, n-type source layer 9 and n-type cathode layer 13 are located inside and outside of p-type drain layer 8 formed in the form of an elongated ring, respectively.

FIG. 12 shows the ninth embodiment of the present invention. It is obtained by modifying the eighth embodiment shown in FIGS. 10 and 11. In the ninth embodiment, a unit element made up of source layer 9, drain layer 8 and gate layer 6 and formed like an elongated ring is located in the center of the wafer. N-type cathode layer 13 is formed only in the straight portions located outside of the unit element.

Figure 13:
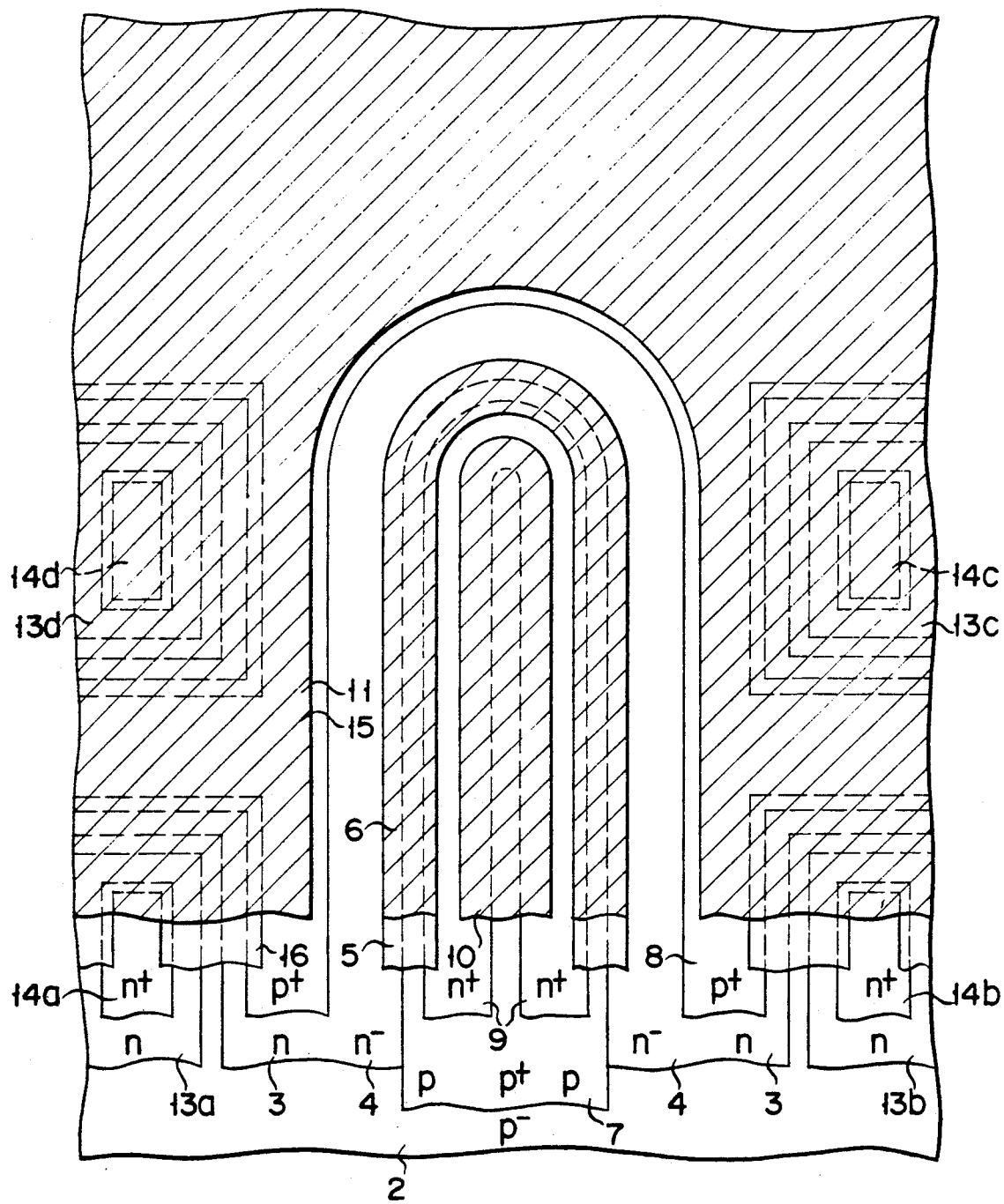
FIG. 13 is a plan view of a lateral conductivity modulated MOSFET according to the tenth embodiment of the present invention.

FIG. 13 shows the tenth embodiment of the present invention. It is obtained by further modifying the eight embodiment shown in FIG. 12, and employs a plurality of cathode layers 13a, 13b, 13c and 13d arranged around the unit element.

The advantages of the sixth to tenth embodiments (FIGS. 7 to 13) are similar to those of the first to fifth embodiments mentioned above.

Figure 14:
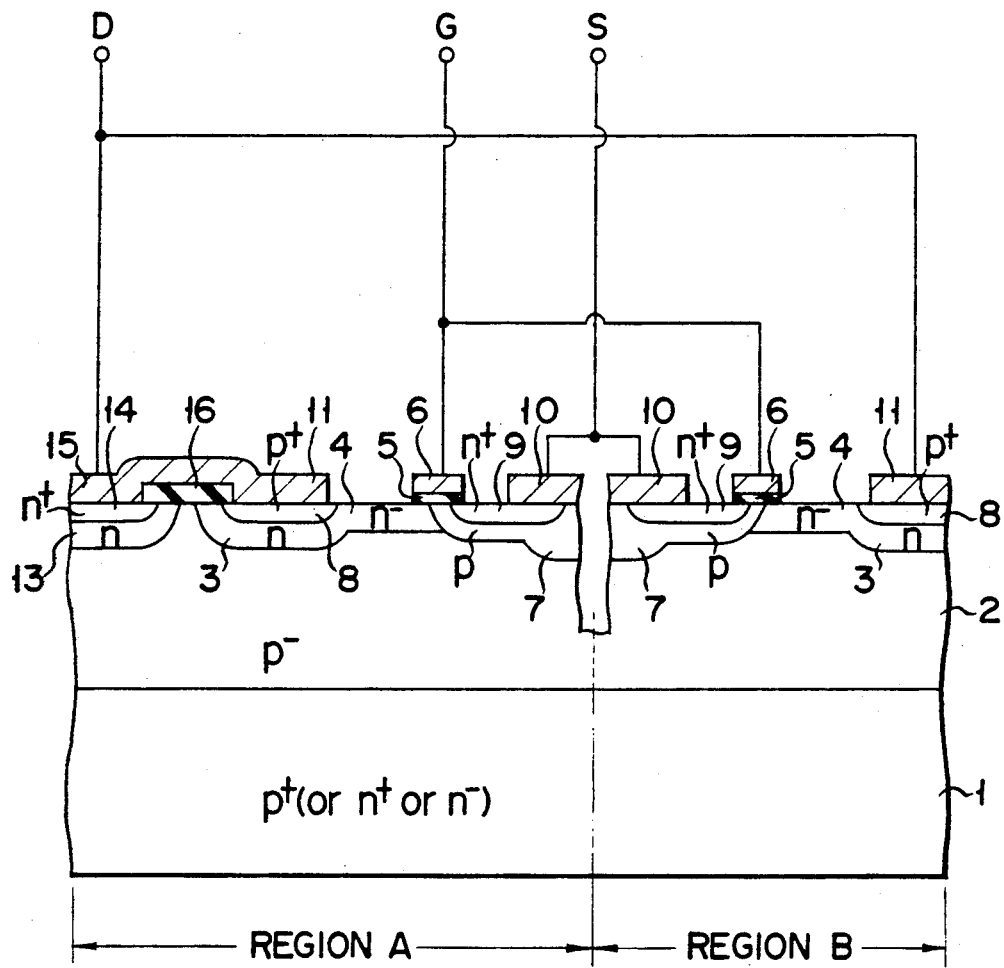
FIG. 14 is a sectional view of one possible modification of the first to tenth embodiments of the present invention.

The foregoing embodiments can be modified in various manners. FIG. 14 shows one example of such modifications. As is shown in FIG. 14, an element of the present invention may be formed in region A of a wafer, with a conventional element formed in region B of the wafer. In addition, the semiconductor wafer need not be limited to an epitaxially-grown wafer; it may be either an FZ wafer or a CZ wafer. Further, the respective layers may have opposite conductivity types to those mentioned above.

Figure 15:
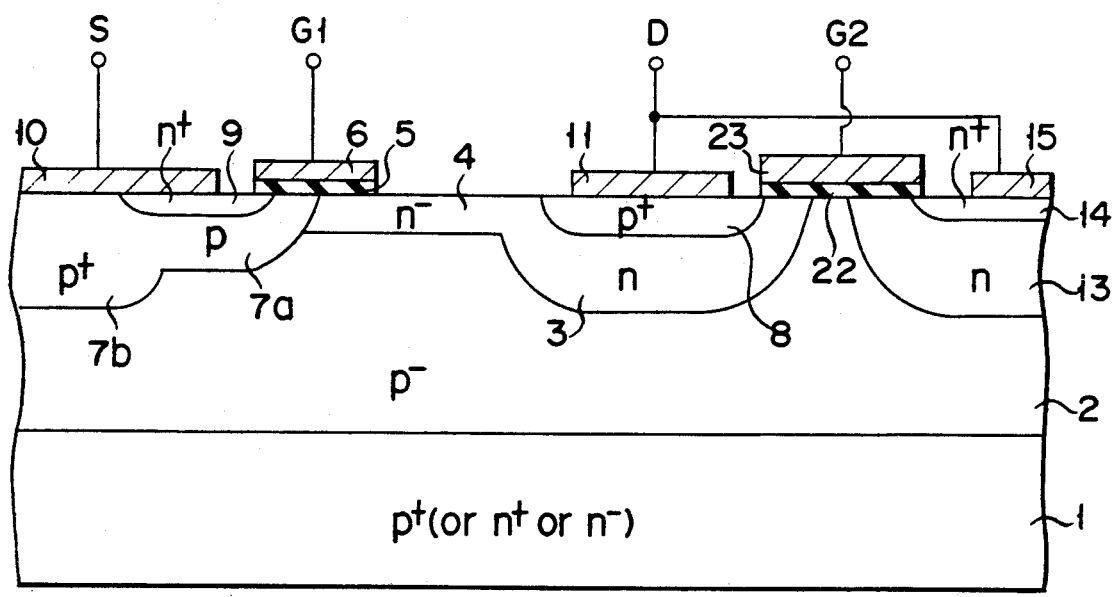
FIG. 15 is a sectional view of a lateral conductivity modulated MOSFET according to the eleventh embodiment of the present invention.

FIG. 15 shows the eleventh embodiment of the present invention. This embodiment is similar to the first embodiment shown in FIG. 2, expect that first gate electrode 6 and second gate electrode 23 are formed. First gate electrode 6 is formed on the surface of p-type base layer 7, with gate insulation film 5 interposed. Second gate electrode 23 is formed on the wafer surface portion located between drain layer 8 interposed. The specific pattern of this structure can be designed such that it becomes similar to the pattern shown in FIG. 7 or 9. The eleventh embodiment may be modified by covering the surface of second gate electrode 23 with an insulation film 25 and by mounting integrally-formed drain and cathode electrodes 11 and 15 over the insulation film 25 formed on second gate electrode 23, as shown in FIG. 18. The fundamental operation of the conductivity modulated MOSFET of the eleventh embodiment is similar to that of the first embodiment shown in FIG. 2. To turn on the conductivity modulated MOSFET of the eleventh embodiment, second gate electrode 23 is applied with a voltage which is negative with reference to the voltage applied to the drain electrode. As a result of the application of this voltage, that surface region of n-type buffer layer 3 which is located below second gate electrode 23 is inverted in polarity, thus forming a channel. As a result, holes are injected from drain layer 8 directly to $p^-$-type layer 2. Since, therefore, the conductivity modulation effect is improved, it is possible to further lower the ON-state voltage. To turn off the MOSFET, second gate electrode 23 is applied with a positive or zero voltage.

Figure 16:
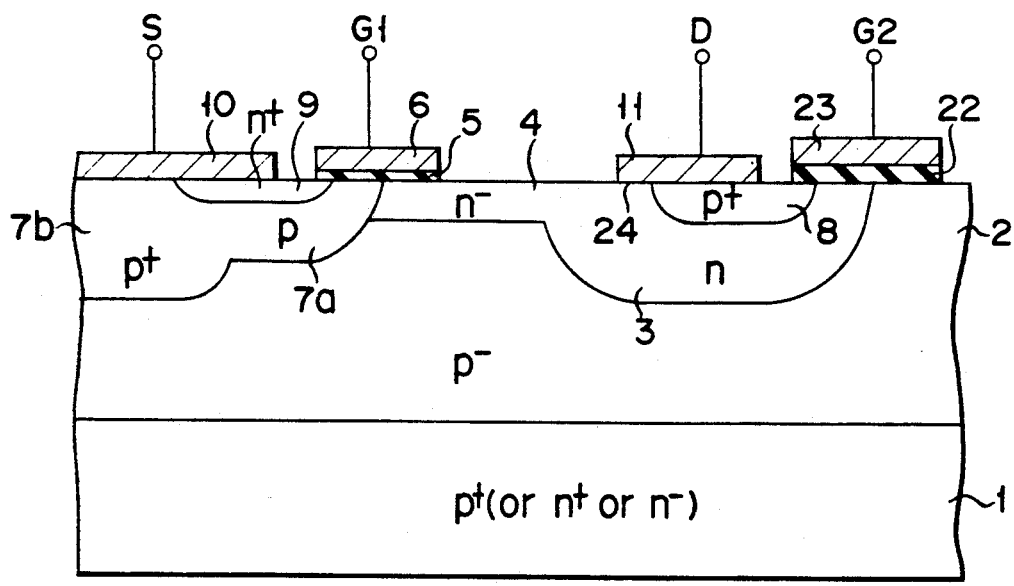
FIG. 16 is a sectional view of a lateral conductivity modulated MOSFET according to the twelfth embodiment of the present invention.

FIG. 16 shows the twelfth embodiment of the present invention. This embodiment differs fundamentally from the foregoing embodiments, in that it employs an anode-short structure provided for drain layer 8. More specifically, part of drain electrode 11 is formed as short-circuit portion 24 in contact with n-type buffer layer 3. The twelfth embodiment employs no cathode layer, and second gate electrode 23 is formed on that surface portion of n-type buffer layer 3 which is sandwiched between drain layer 8 and $p^-$-type layer 2, with gate insulation film 22 interposed.

To turn on the conductivity modulated MOSFET of the twelfth embodiment, a negative bias is applied to second gate electrode 23, as in the eleventh embodiment shown in FIG. 12. As a result of the application of this bias, holes are injected from drain layer 8 into p-type layer 2, through the channel region formed in that surface region of n-type buffer layer 3 which is located below second gate electrode 23. Therefore, the conductivity modulation effect is remarkable. The reverse conduction function of the device of the twelfth embodiment is achieved by the pn junction diode constituted by n-type buffer layer 3, $n^-$-type drift layer 4 and $p^-$-type base layer 7.

In the conductivity modulated MOSFET of the twelfth embodiment, the problem entailed by the use of an anode-short structure (i.e., a decrease in the rate of the hole injection from a drain layer) is solved in a different fashion from that of the first embodiment.

FIG. 17 shows the thirteenth embodiment of the present invention. This embodiment is a combination of the eleventh and twelfth embodiments which are shown in FIGS. 15 and 16, respectively. The advantages of the thirteenth embodiment are similar to those of the foregoing embodiments, though explanation of the operation of the thirteenth embodiment is omitted.

What is claimed is:

1. A lateral conductivity modulated MOSFET, comprising:
   a semiconductor layer of a first conductivity type;
   a first-conductivity type base layer selectively formed in a surface region of said semiconductor layer;
   a second-conductivity type source layer selectively formed in a surface region of said first-conductivity type base layer;
   a second-conductivity type base layer selectively formed in said semiconductor layer;
   a first-conductivity type drain layer formed in a surface region of said second-conductivity type base layer;
   a gate insulation film formed on that surface portion of the first-conductivity type base layer which is sandwiched between said source layer and said second-conductivity type base layer;
   a gate electrode formed on said gate insulation film;
   a source electrode in contact with both said source layer and said first-conductivity type base layer;
   a drain electrode in contact with said drain layer;
   a second-conductivity type cathode layer formed in a surface region of said semiconductor layer in such a manner that said second-conductivity type cathode layer is located adjacent to said second-conductivity type base layer and separated from said second-conductivity type base layer; and
   a cathode electrode in contact with said cathode layer, said cathode electrode being kept at the same potential level as that of said drain electrode.

2. A conductivity modulated MOSFET according to claim 1, wherein an insulation film is formed in such a manner as to extend between the surface of said drain layer and the surface of said cathode layer, said drain electrode and said cathode electrode being integral with each other and formed on said insulation film.

3. A conductivity modulated MOSFET according to claim 1, wherein said semiconductor layer is formed above a semiconductor substrate and isolated by a dielectric from said semiconductor substrate.

4. A conductivity modulated MOSFET according to claim 1, wherein said gate electrode is in the form of a first ring disposed above an upper surface of said semiconductor layer, said source layer is located at an outer periphery of a projection of the first ring onto said semiconductor layer, said drain layer is in the form of a second ring and is located inside of said projection of the first ring, and said cathode layer is located inside of said drain layer.

5. A conductivity modulated MOSFET according to claim 1, wherein said gate electrode is in the form of a first ring disposed above an upper surface of said semiconductor layer, said source layer is located at an inner periphery of a projection of the first ring onto said semiconductor layer, said drain layer is located outside of said projection of the first ring, and said cathode layer is located outside of said drain layer.

6. A lateral conductivity modulated MOSFET, comprising:
 a semiconductor layer of a first conductivity type;
 a first-conductivity type base layer selectively formed in a surface region of said semiconductor layer;
 a second-conductivity type source layer selectively formed in a surface region of said first-conductivity type base layer;
 a second-conductivity type base layer selectively formed in said semiconductor layer;
 a first-conductivity type drain layer formed in a surface region of said second-conductivity type base layer;
 a first gate insulation film formed on that surface portion of the first-conductivity type base layer which is sandwiched between said source layer and said second-conductivity type base layer;
 a first gate electrode formed on said first gate insulation film;
 a source electrode in contact with both said source layer and said first-conductivity type base layer;
 a drain electrode in contact with said drain layer;
 a second-conductivity type cathode layer formed in a surface region of said semiconductor layer in such a manner that said second-conductivity type cathode layer is located adjacent to said second-conductivity type base layer and separated from said second-conductivity type base layer;
 a cathode electrode in contact with said cathode layer, said cathode electrode being kept at the same potential level as that of said drain electrode;
 a second gate insulation film formed on that surface portion of the second-conductivity type base layer which is sandwiched between said drain layer and said cathode layer; and
 a second gate electrode formed on said second gate insulation film.

7. A conductivity modulated MOSFET according to claim 6, wherein an insulation film is formed on the surface of said second gate electrode, said drain electrode and said cathode electrode being integral with each other and formed on said insulation film.

8. A conductivity modulated MOSFET according to claim 6, wherein said semiconductor layer is formed above a semiconductor substrate and isolated by a dielectric from said semiconductor substrate.

9. A conductivity modulated MOSFET according to claim 6, wherein said first gate electrode is in the form of a first ring disposed above said semiconductor layer, said source layer is located at an outer periphery of a projection of the first ring onto said semiconductor layer, said drain layer is in the form of a second ring and is located inside of said projection of the first ring, and said cathode layer is located inside of said drain layer.

10. A conductivity modulated MOSFET according to claim 9, wherein said second gate electrode is formed between said drain layer and said cathode layer.

11. A conductivity modulated MOSFET according to claim 6, wherein said first gate electrode is in the form of a first ring disposed above said semiconductor layer, said source layer is located at an inner periphery of a projection of the first ring onto said semiconductor layer, said drain layer is located outside of said projection of the first ring, and said cathode layer is located outside of said drain layer.

12. A conductivity modulated MOSFET according to claim 11, wherein an insulation film is formed on the surface of said second gate electrode, said drain electrode and said cathode electrode being integral with each other and formed on said insulation film.

13. A lateral conductivity modulated MOSFET, comprising:
 a semiconductor layer of a first conductivity type;
 a first-conductivity type base layer selectively formed in a surface region of said semiconductor layer;
 a second-conductivity type source layer selectively formed in a surface region of said first-conductivity type base layer;
 a second-conductivity type base layer selectively formed in said semiconductor layer;
 a first-conductivity type drain layer formed in a surface region of said second-conductivity type base layer;
 a first gate insulation film formed on that surface portion of the first-conductivity type base layer which is sandwiched between said source layer and said second-conductivity type base layer;
 a first gate electrode formed on said first gate insulation film;
 a source electrode in contact with both said source layer and said first-conductivity type base layer;
 a drain electrode in contact with both said drain layer and said second-conductivity type base layer;
 a second gate insulation film formed on that surface portion of the second-conductivity type base layer which is sandwiched between said drain layer and a semiconductor layer portion located adjacent to said drain layer; and
 a second gate electrode formed on said second gate insulation film.

14. A conductivity modulated MOSFET according to claim 13, wherein said semiconductor layer is formed above a semiconductor substrate and isolated by a dielectric from said semiconductor substrate.

15. A lateral conductivity modulated MOSFET, comprising:
 a semiconductor layer of a first conductivity type;
 a first-conductivity type base layer selectively formed in a surface region of said semiconductor layer;
 a second-conductivity type source layer selectively formed in a surface region of said first-conductivity type base layer;
 a second-conductivity type base layer selectively formed in said semiconductor layer;
 a first-conductivity type drain layer formed in a surface region of said second-conductivity type base layer;
 a first gate insulation film formed on that surface portion of the first-conductivity type base layer which is sandwiched between said source layer and said second-conductivity type base layer;

a first gate electrode formed on said first gate insulation film;

a source electrode in contact with both said source layer and said first-conductivity type base layer;

a drain electrode in contact with both said drain layer and said second-conductivity type base layer;

a second-conductivity type cathode layer formed in a surface region of said semiconductor layer in such a manner that said second-conductivity type cathode layer is located adjacent to said second-conductivity type base layer and separated from said second-conductivity type base layer;

a cathode electrode in contact with said cathode layer, said cathode electrode being kept at the same potential level as that of said drain electrode;

a second gate insulation film formed on that surface portion of the second-conductivity type base layer which is sandwiched between said drain layer and said cathode layer; and a second gate electrode formed on said second gate insulation film.

16. A conductivity modulated MOSFET according to claim 15, wherein an insulation film is formed on said second gate electrode, said drain electrode and said cathode electrode being integral with each other and formed on said insulation film.

17. A conductivity modulated MOSFET according to claim 15, wherein said semiconductor layer is formed above a semiconductor substrate and isolated by a dielectric from said semiconductor substrate.

18. A conductivity modulated MOSFET according to claim 15, wherein said first gate electrode is in the form of a first ring disposed above said semiconductor layer, said source layer is located at an outer periphery of a projection of the first ring onto said semiconductor layer, said drain layer is in the form of a second ring and is located inside of said projection of the first ring, and said cathode layer is located inside of said drain layer.

19. A conductivity modulated MOSFET according to claim 18, wherein said second gate electrode is formed between said drain layer and said cathode layer.

20. A conductivity modulated MOSFET according to claim 15, wherein said first gate electrode is in the form of a first ring disposed above said semiconductor layer, said source layer is located at a inner periphery of a projection of the first ring onto said semiconductor layer, said drain layer is located outside of said projection of the first ring, and said cathode layer is located outside of said drain layer.

21. A conductivity modulated MOSFET according to claim 20, wherein a third insulation film is formed over the surface of said second gate electrode, said drain electrode and said cathode electrode being integral with each other and formed over said third insulation film.

* * * * *